United States Patent
Liao (10) Patent No.: US 6,391,708 B1
(45) Date of Patent: *May 21, 2002

(54) METHOD OF MANUFACTURING DRAM CAPACITOR

(75) Inventor: Kuan-Yang Liao, Taipei (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,150

(22) Filed: Oct. 23, 1998

(30) Foreign Application Priority Data

Jul. 30, 1998  (TW) ...................... 87112531 A (51) Int. Cl.$^7$ .......................... H01L 21/8242
(52) U.S. Cl. ................. 438/253; 438/255; 438/396; 438/398; 438/947
(58) Field of Search ................ 438/253, 254, 438/255, 396, 397, 398; 257/306, 307, 308, 309

(56) References Cited

U.S. PATENT DOCUMENTS

| | | | | |
|---|---|---|---|---|
| 5,158,905 A | * | 10/1992 | Ahn | 438/396 |
| 5,164,881 A | * | 11/1992 | Ahn | 438/396 |
| 5,227,322 A | * | 7/1993 | Ko et al. | 438/387 |
| 5,466,627 A | * | 11/1995 | Lur et al. | 438/396 |
| 5,616,511 A | * | 4/1997 | Hirota | 438/396 |
| 5,650,351 A | * | 7/1997 | Wu | 438/396 |
| 5,670,405 A | * | 9/1997 | Tseng | 438/396 |
| 5,670,406 A | * | 9/1997 | Tseng | 438/396 |
| 5,681,774 A | * | 10/1997 | Tseng | 438/396 |
| 5,976,444 A | * | 11/1999 | Pearson et al. | 264/255 |
| 6,150,217 A | * | 11/2000 | Chang et al. | 438/255 |

OTHER PUBLICATIONS

Wolf et al., "Dry Etching For VLSI Fabrication", Silicon Processing For the VLSI Era, vol. 1—Process Technology, pp. 540–541 (1986).*

* cited by examiner

*Primary Examiner*—Carl Whitehead, Jr.
*Assistant Examiner*—Toniae M. Thomas
(74) *Attorney, Agent, or Firm*—Jiawei Huang; P.C. Patents

(57) ABSTRACT

A method of manufacturing a DRAM capacitor comprises the steps of providing a semiconductor substrate having a source/drain region thereon, and then forming an insulating layer over the substrate. Next, a storage node opening that exposes the source/drain region is formed in the insulating layer, and then a conductive layer is formed above the storage node opening and the insulating layer. Thereafter, porous insulating material is deposited over the first conductive layer. The porous material includes porous oxide, NanoPorous Silica or Xerogel Sol-Gel, for example. Subsequently, the porous insulating layer is used as a mask to carry out a plasma-etching operation so that a portion of the conductive layer is etched away to form a plurality of long and narrow crevices. Hence, a fork-shaped conductive layer is formed. The fork-shaped first conductive layer serves as the lower electrode of a capacitor. Finally, the porous insulating layer is removed, and then the dielectric layer and the upper electrode of a capacitor are sequentially formed over the fork-shaped structure.

27 Claims, 6 Drawing Sheets

FIG. 5

METHOD OF MANUFACTURING DRAM CAPACITOR

CROSS-REFERENCE TO RELATED APPLICATION

This application claims the priority benefit of Taiwan application serial no. 87112531, filed Jul. 30, 1998, the full disclosure of which is incorporated herein by reference.

BACKGROUND OF THE INVENTION

1. Field of Invention

The present invention relates to a method of manufacturing a dynamic random access memory (DRAM) capacitor. More particularly, the present invention relates to a method that utilizes a porous oxide layer in the process of forming a DRAM capacitor.

2. Description of Related Art

At present, ultra-large scale integration (ULSI) semiconductor fabrication techniques have considerably increased circuit density on a silicon chip. However, to achieve high circuit density, the dimensions of each device must be downsized correspondingly and devices must be packed closer together. Since the structure of DRAM is suitable for high-density packing, DRAMs are extensively used in the electronic industry for data storage. Each DRAM comprises a large number of memory cells, and data is stored according to the charging state in the capacitor of a memory cell. The data is accessed through memory peripheral address and read/write circuits around the silicon chip. Furthermore, each DRAM cell includes a field effect transistor (FET) and a capacitor so that a single bit of information is represented by each cell. The capacitor of a DRAM cell is a critical element of the unit. The larger the amount of electric charges that can be stored in a DRAM capacitor, the smaller the effect of noise on the read out data is. For example, soft errors due to a - particles can be greatly reduced.

As the number of transistors on a DRAM chip continues to increase, the size of each transistor must be reduced. Consequently, the amount of charges within each DRAM capacitor must be small enough to produce an acceptable signal-to-noise level. However, if the amount of charges stored in a capacitor is further lowered, the number of refresh cycles has to be increased. Therefore, in order to provide a larger capacitance without having to occupy a greater surface area on a silicon chip, more efficient capacitor structures are required.

Figure 1:
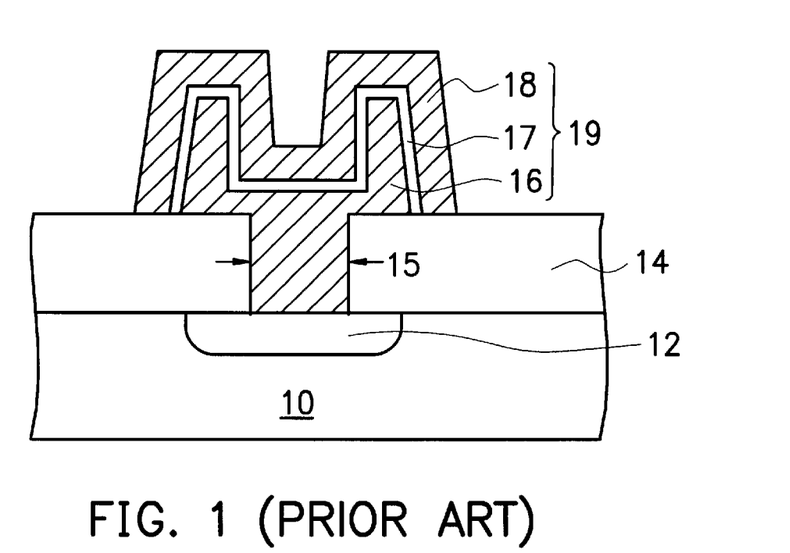
FIG. 1 is a schematic, cross-sectional view of a conventional, cylindrical-type, stacked capacitor.
Figure 2:
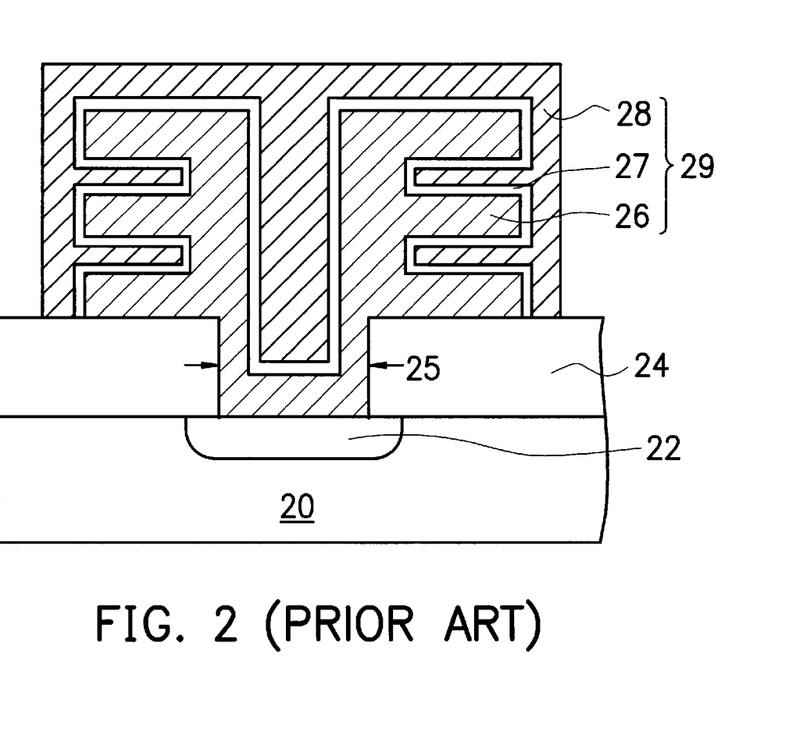
FIG. 2 is a schematic, cross-sectional view of a conventional, fin-type, stacked capacitor.

In general, trench-type and stacked-type capacitors are the two most commonly used capacitor structures. Among the two, trench-type capacitors are less frequently used because they are more difficult to fabricate. A stacked capacitor has a structure that extends vertically up from a substrate surface, and hence is capable of providing greater capacitor area without having to deal with too many manufacturing problems. There are a number of variations in the design of a stacked capacitor. FIG. 1 is a cross-sectional view of a conventional, cylindrical-type, stacked capacitor, and FIG. 2 is a cross-sectional view of a conventional, fin-type stacked capacitor. Both cylindrical and fin-type capacitors are capable of increasing surface area of the capacitor so that more electric charges can be stored.

The cylindrical-shaped capacitor shown in FIG. 1 is built upon a semiconductor substrate 10. The capacitor has a source/drain region 12 in the substrate 10 and an insulating layer 14 above the substrate 10. Within the insulating layer 14, there is a storage node opening 15. Furthermore, there is a cylindrical-shaped capacitor structure 19 in and on top of the storage node opening 15. The cylindrical-shaped capacitor structure 19 further includes a lower electrode 16, a dielectric layer 17 and an upper electrode 18.

The fin-shaped capacitor as shown in FIG. 2 is built upon a semiconductor substrate 20. The capacitor has a source/drain region 22 in the substrate 20 and an insulating layer 24 above the substrate 20. Within the insulating layer 24, there is a storage node opening 25. Furthermore, there is a fin-shaped capacitor structure 29 in and on top of the storage node opening 25. The fin-shaped capacitor structure 29 further includes a lower electrode 26, a dielectric layer 27 and an upper electrode 28.

Although the above stacked capacitors can increase the surface area of a capacitor somewhat, larger surface area and more efficient methods of fabrication are always in demand to bring down the cost.

In light of the foregoing, there is still a need to improve the method of manufacturing DRAM capacitor.

SUMMARY OF THE INVENTION

Accordingly, the present invention provides a method that employs plasma-etching techniques in combination with a porous oxide layer mask for manufacturing a DRAM capacitor whose lower electrode has a larger surface area.

To achieve these and other advantages and in accordance with the purpose of the invention, as embodied and broadly described herein, the invention provides a method of manufacturing a DRAM capacitor. The method includes the steps of providing a semiconductor substrate having a source/drain region thereon, and then forming an insulating layer over the substrate. Next, a storage node opening that exposes the source/drain region is formed in the insulating layer, and then a first conductive layer is formed above the storage node opening and the insulating layer. Thereafter, porous insulating material is deposited over the first conductive layer. The porous material includes porous oxide, sold under the trademark NanoPorous Silicon™ or a Xerogel Sol-Gel# for example. Subsequently, the porous oxide layer is used as a mask for carrying out a plasma-etching operation so that a portion of the first conductive layer is etched away. Therefore, a multiple of long and narrow crevices is etched out forming a fork-shaped first conductive layer structure. The fork-shaped first conductive layer serves as the lower electrode of a capacitor. Subsequently, the porous oxide layer is removed, and then a dielectric layer is formed over the fork-shaped structure. Finally, a second conductive layer that serves as the upper electrode of a capacitor is formed over the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

One major aspect of this invention is the utilization of a porous oxide layer as a mask. Together with the application of a plasma-etching operation, the surface area of the lower electrode can be considerably increased, thereby effectively increasing the capacitance of the DRAM capacitor.

Figure 3A:
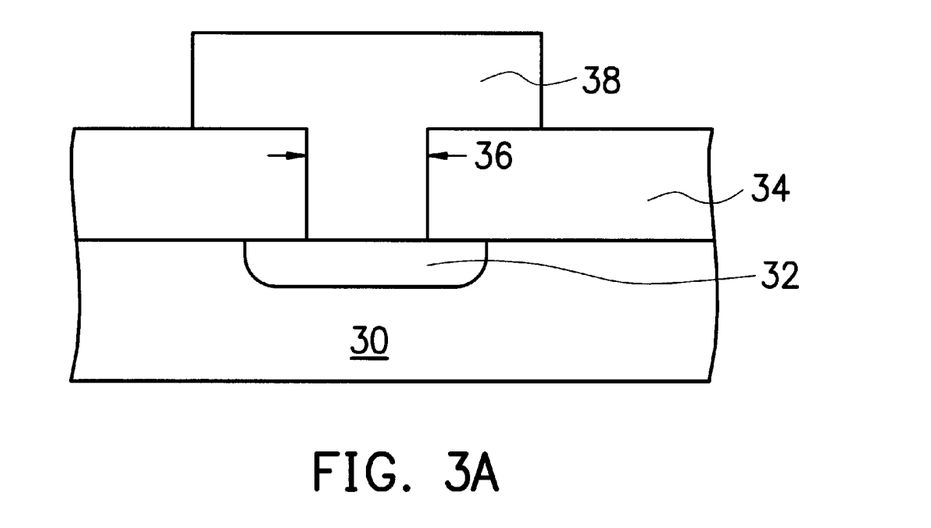
FIGS. 3A through 3E are schematic, cross-sectional views showing the progression of manufacturing steps in fabricating a DRAM capacitor according to one preferred embodiment of this invention.

FIGS. 3A through 3E are schematic, cross-sectional views showing the progression of manufacturing steps in fabricating a DRAM capacitor according to one preferred embodiment of this invention. First, as shown in FIG. 3A, a semiconductor substrate 30 having a source/drain region 32 thereon is provided. Next, an insulating layer, preferably a silicon oxide layer, is formed over the substrate 30, and then a storage node opening 36 exposing the source/drain region 32 is formed in the insulating layer 34. Thereafter, a first conductive layer 38, preferably a polysilicon layer, is formed in the storage node opening 36 and above the insulating layer 34, and then the first conductive layer 38 is patterned.

Figure 3B:
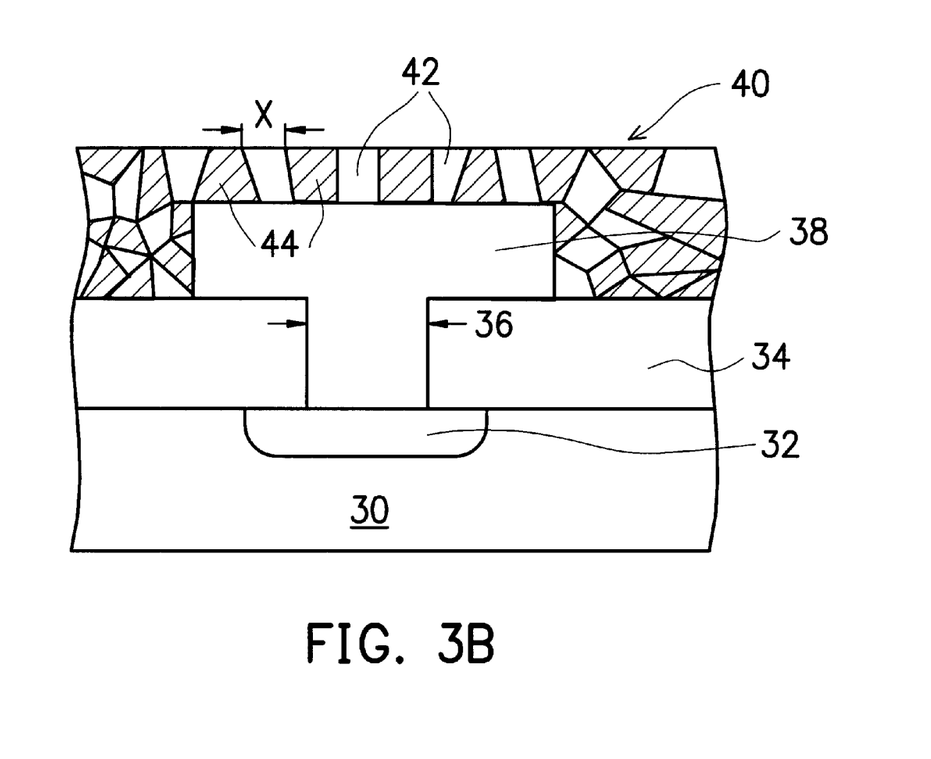

Next, as shown in FIG. 3B, a porous insulating layer 40 is formed over the first conductive layer 38. The porous insulating layer 40 can be, for example, a porous oxide layer of nanoporous silica or a porous oxide layer of xerogel sol-gel. Nanoporous silica and xerogel sol-gel are types of low-k dielectric material. The porous insulating layer 40 is formed by depositing and spinning for about 30 seconds, and then an edge bead removal operation is conducted for another 15 seconds. Next, reaction is carried out for about 120 seconds, and then a drying and baking process is performed for another 120 seconds.

After that, a porous insulating layer having a thickness of about 500 Å to 2000 Å is formed over the conductive layer 38. In general, a porous insulating layer 40 can be divided into two portions, one portion is the pores 42 while the other portion is the grains 44. The size of each pore 42 ranges from 20 nm to 40 nm. The ultimate size of the pores can be controlled by changing parameters such as reacting material, temperature, acidity/alkalinity value, reaction time or drying conditions.

Figure 3C:
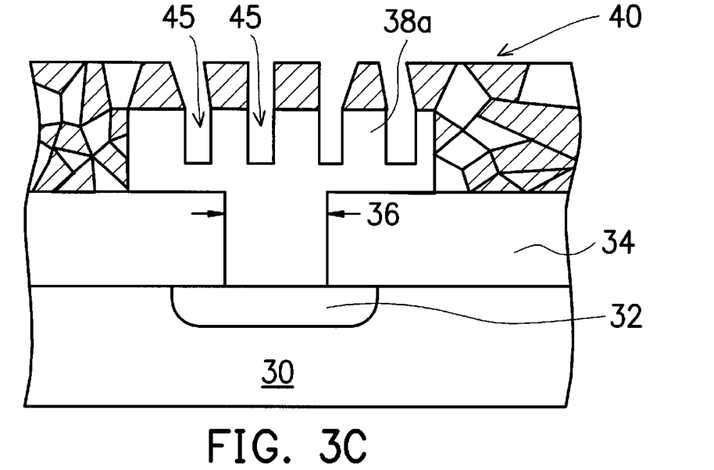

As shown in FIG. 3C, using the porous insulating layer 40 as a mask, a plasma-etching operation is carried out. Etching of the underlying first conductive layer 38 starts in locations where the pores 42 are situated. In other areas, the first conductive layer 38 is covered by the grains 44 of the porous insulating layer 40, and therefore protected from attack by plasmas. Ultimately, the first conductive layer 38 turns into a fork-shaped structure 38a. The fork-shaped structure 38a serves as the lower electrode of a capacitor. The bottom part of the fork-shaped structure 38a is separated from the insulating layer 34 by a distance of roughly 100 Å. Since the size of pores 42 is around 20 nm to 40nm, the long and narrow crevices 45 also have a width of roughly 20 nm to 40 nm. For example, if the width of the first conductive layer 38 is about 300 nm, a total of about six prongs 39 can be formed in the fork-shaped structure 38a.

Figure 3D:
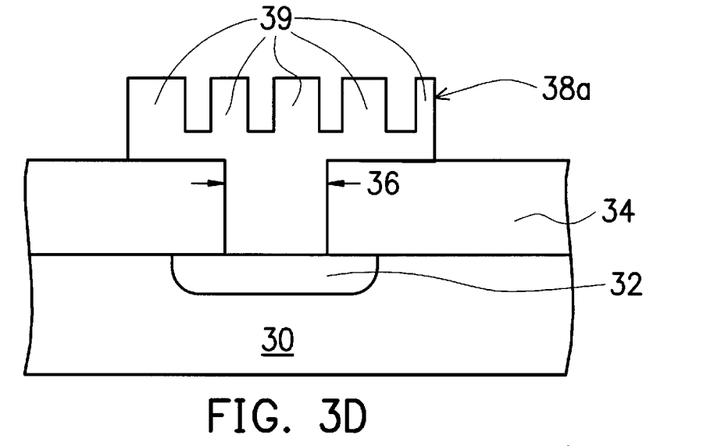

Next, as shown in FIG. 3D, the porous insulating layer 40 is stripped away to expose the fork-shaped structure 38a that has a number of prongs 39. The method of stripping away the porous insulating layer 40 includes a wet etching method or a dry etching method.

Figure 3E:
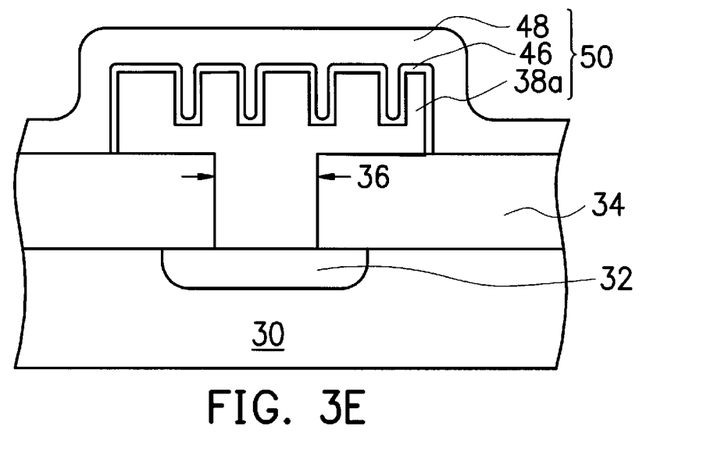

Next, as shown in FIG. 3E, a dielectric layer 46 is formed over the fork-shaped structure 38a, and then a second conductive layer 48 is formed over the dielectric layer 46. The second conductive layer 48 serves as the upper electrode of a capacitor. Preferably, the dielectric layer 46 is made from a high-k dielectric material, for example, tantalum pentoxide ($Ta_2O_5$), nitride/oxide (NO) or oxide/nitride/oxide (ONO). The second conductive layer 48 is preferably a polysilicon layer. The second conductive layer 48, the dielectric layer 46 and the fork-shaped structure 38a together form a capacitor structure 50.

Figure 4A:
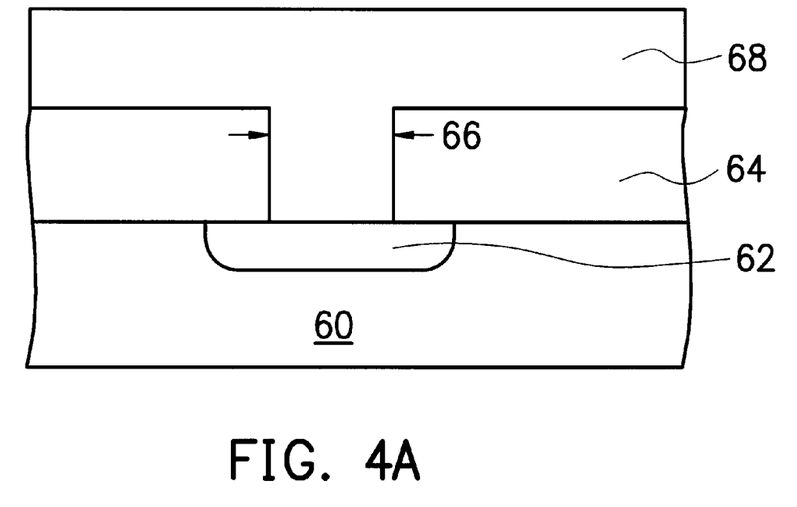
FIGS. 4A through 4E are cross-sectional views showing the progression of manufacturing steps in fabricating a DRAM capacitor according to the second preferred embodiment of this invention.

FIGS. 4A through 4E are cross-sectional views showing the progression of manufacturing steps in fabricating a DRAM capacitor according to the second preferred embodiment of this invention. First, as shown in FIG. 4A, a semiconductor substrate 60 having a source/drain region 62 thereon is provided. Next, an insulating layer 64, preferably a silicon oxide layer, is formed over the substrate 60, and then a storage node opening 66 exposing the source/drain region 62 is formed in the insulating layer 64. Thereafter, a first conductive layer 68, preferably a polysilicon layer, is formed in the storage node opening 66 and above the insulating layer 64.

Figure 4B:
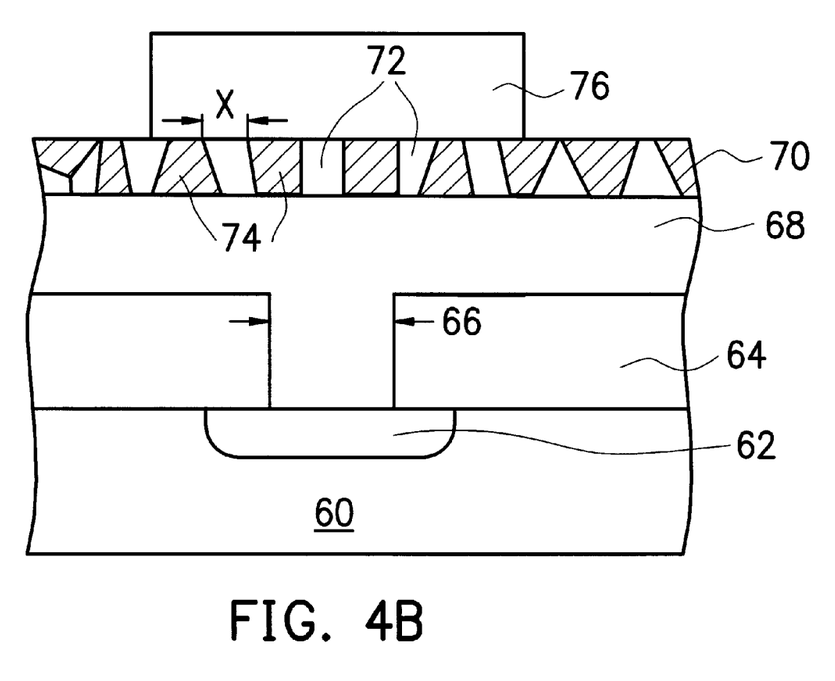

Next, as shown in FIG. 4B, a porous insulating layer 70 is formed over the first conductive layer 68. The porous insulating layer 70 can be, for example, a porous oxide layer of nanoporous silica or a porous oxide layer of xerogel sol-gel. Nanoporous silica and xerogel sol-gel are types of low-k dielectric material. The porous insulating layer 70 is formed by depositing with spinning for about 30 seconds, and then performing an edge bead removal operation for another 15 seconds. Next, reaction is carried out for about 120 seconds, and then a drying and baking process is performed for another 120 seconds. Finally, a porous insulating layer having a thickness of about 500 Å to 2000 Å is formed over the conductive layer 68. In general, a porous insulating layer 70 can be divided into two portions, one portion is the pores 72 while the other portion is the grain 74. The size of each pore 72 ranges between 20 nm to 40 nm. The ultimate size of the pores 72 can be controlled by changing such parameters as reacting material, temperature, acidity/alkalinity value, reacting time or drying conditions. Thereafter, a photoresist layer 76 is deposited over the porous insulating layer 70, and then the photoresist layer is patterned.

Figure 4C:
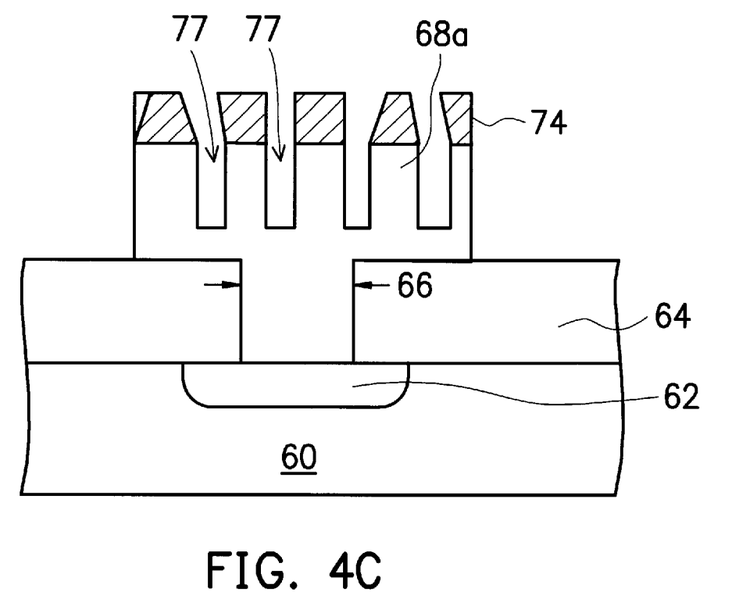

Next, as shown in FIG. 4C, using the photoresist layer 76 as a mask, an anisotropic etching operation is carried out to pattern the porous insulating layer 70 and the first conductive layer 68. Subsequently, the photoresist layer 76 is removed. Thereafter, using the porous insulating layer 70 as a mask, a plasma etching operation is carried out to form a plurality of long and narrow crevices 77 in the first conductive layer 68. Consequently, the first conductive layer 68 is transformed into a fork-shaped structure 68a, which acts as the lower electrode of the capacitor. The bottom part of the fork-shaped structure 68*a* is roughly at a distance of 100 Å from the insulating layer 64. Because size of the pores 72 range between 20 to 40 nm, average width of the crevices also range between 20 to 40 nm. For example, if the first conductive layer 68 has an overall width of about 300 Å, the fork-shaped structure 68*a* can have six prongs 78 altogether.

Figure 4D:
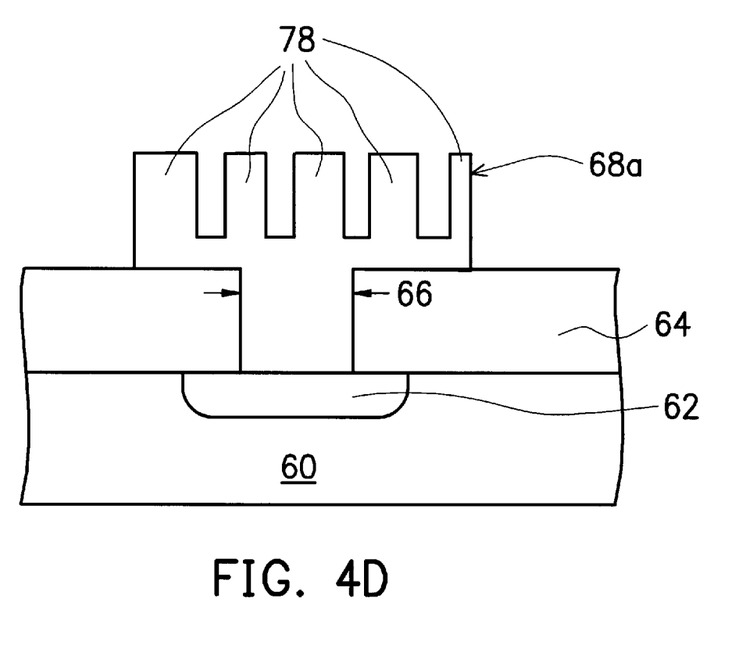

Next, as shown in FIG. 4D, the porous insulating layer 70 is stripped away to expose the fork-shaped structure 68*a* including its prongs 78. The method of stripping away the porous insulating layer 70 includes a wet etching method or a dry etching method. Alternatively, the porous insulating layer 70 can be removed by a plasma oxygen treatment.

Figure 4E:
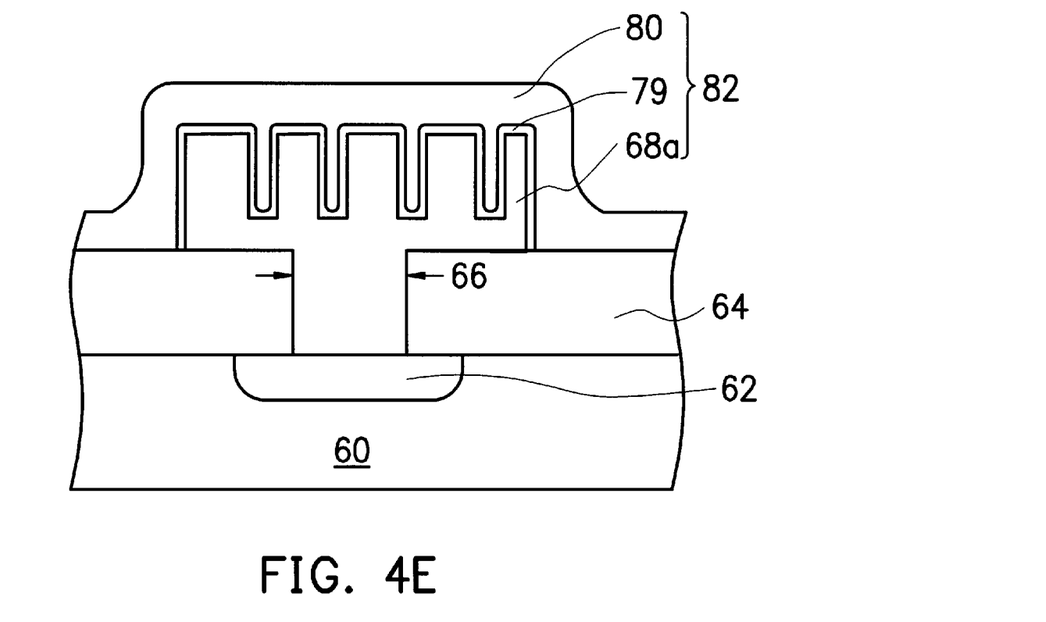

Next, as shown in FIG. 4E, a dielectric layer 79 is formed over the fork-shaped structure 68*a*, and then a second conductive layer 80 is formed over the dielectric layer 79. The second conductive layer 80 serves as the upper electrode of a capacitor. Preferably, the dielectric layer 79 is made from a high-k dielectric material, for example, tantalum pentoxide ($Ta_2O_5$), nitride/oxide (NO) or oxide/nitride/oxide (ONO). The second conductive layer 80 is preferably a polysilicon layer. The second conductive layer 80, the dielectric layer 79 and the fork-shaped structure 68a together forms a second capacitor structure 82.

Figure 5:
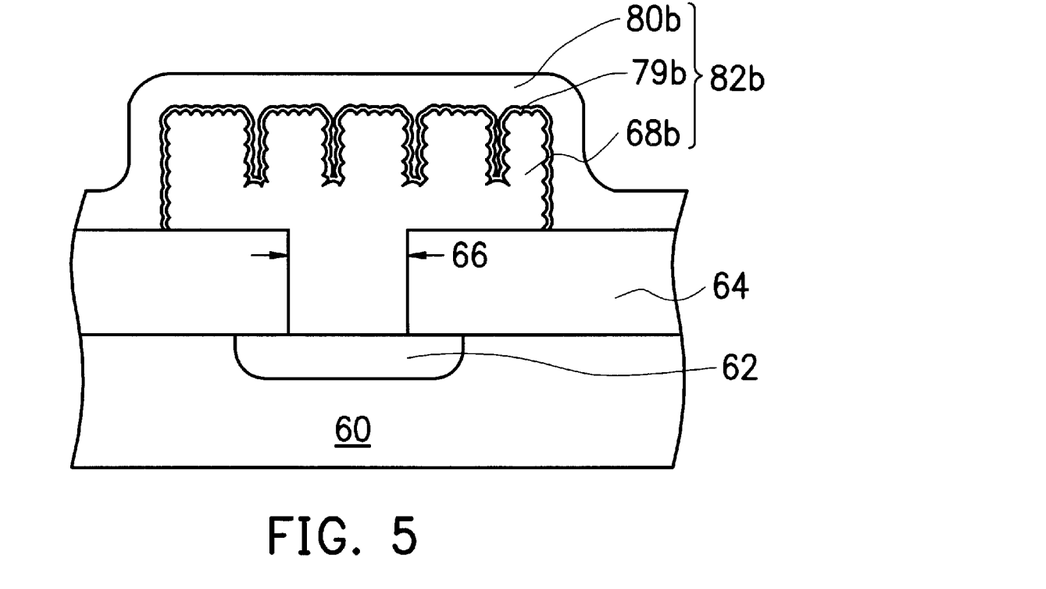
FIG. 5 is a schematic, cross-sectional view showing a DRAM capacitor according to third preferred embodiment of this invention.

FIG. 5 is a cross-sectional view showing a DRAM capacitor according to third preferred embodiment of this invention. Those parts identical to the ones shown in FIG. 4E are labeled with the same numbers in FIG. 4E. The difference between FIG. 4E and FIG. 5 lies in the operation after the fork-shaped structure 68*a* is formed. As shown in FIG. 5, hemispherical grained polysilicon (HSG-poly) layer 68b is formed over the fork-shaped structure 68*a*. The HSG-poly layer 68*b* has a very rough surface, and hence is capable of increasing the surface area of the lower electrode even further.

Thereafter, a dielectric layer 79*b* and an upper electrode 80*b* are formed sequentially above the HSG-poly layer 68*b*. Preferably, the dielectric layer 79*b* is made from a high-k dielectric material, for example, tantalum pentoxide ($Ta_2O_5$), nitride/oxide (NO) or oxide/nitride/oxide (ONO). The upper electrode 80*b* is preferably a polysilicon layer. The upper electrode 80*b*, the dielectric layer 79*b* and the fork-shaped structure with HSG-poly layer 68*b* together form another capacitor structure 82*b*.

In summary, the advantages of using the method of this invention to fabricate a DRAM capacitor are as follows:

1. A larger surface area for the lower electrode of a capacitor can be obtained by using a porous oxide layer as a mask together with a plasma-etching operation.

2. An even larger surface area can be obtained for the lower electrode of the capacitor with the addition of a layer of hemispherical grained polysilicon over the fork-shaped structure formed by this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing the capacitor of dynamic random access memory, comprising the steps of:

providing a semiconductor substrate that has a source/drain region formed thereon;

forming an insulating layer over the substrate, and then forming a storage node opening in the insulating layer, wherein the storage node opening exposes the source/drain region;

forming a first conductive layer in the storage node opening and above the insulating layer;

forming a porous insulating layer of low-K dielectric material by depositing nanoporous silica over the first conductive layer;

etching the first conductive layer using the porous insulating layer as a mask, thereby forming a plurality of long and narrow crevices in the first conductive layer so that the first conductive layer becomes a fork-shaped structure that later functions as a lower electrode of the capacitor after finally removing the porous insulating layer; and forming a dielectric layer over the fork-shaped structure and then forming a second conductive layer over the dielectric layer, wherein the second conductive layer serves as an upper electrode of the capacitor.

2. A method of manufacturing the capacitor of dynamic random access memory, comprising the steps of:

providing a semiconductor substrate that has a source/drain region formed thereon;

forming an insulating layer over the substrate, and then forming a storage node opening in the insulating layer, wherein the storage node opening exposes the source/drain region;

forming a first conductive layer in the storage node opening and above the insulating layer;

forming a porous insulating layer of low-K dielectric material by depositing xerogel sol-gel over the first conductive layer;

etching the first conductive layer using the porous insulating layer as a mask, thereby forming a plurality of long and narrow crevices in the first conductive layer so that the first conductive layer becomes a fork-shaped structure that later functions as a lower electrode of the capacitor after finally removing the porous insulating layer; and forming a dielectric layer over the fork-shaped structure and then forming a second conductive layer over the dielectric layer, wherein the second conductive layer serves as an upper electrode of the capacitor.

3. A method of manufacturing an capacitor of dynamic random access memory, comprising the steps of:

providing a semiconductor substrate that has a source/drain region formed thereon;

forming an insulating layer over the substrate, and then forming a storage node opening in the insulating layer, wherein the storage node opening exposes the source/drain region;

forming a first conductive layer in the storage node opening and above the insulating layer;

forming a porous insulating layer over the first conductive layer by depositing and spinning the porous insulating materials for about 30 seconds, performing an edge bead removal operation for 15 seconds, reacting for about 120 seconds, and, finally, drying and baking for another 120 seconds;

etching the first conductive layer using the porous insulating layer as a mask, thereby forming a plurality of long and narrow crevices in the first conductive layer so that the first conductive layer becomes a fork-shaped structure that later functions as a lower electrode of the capacitor after finally removing the porous insulating layer; and forming a dielectric layer over the fork-shaped structure and then forming a second conductive layer over the dielectric layer, wherein the second conductive layer serves as an upper electrode of the capacitor.

4. The method of claim 3, wherein the step of forming the insulating layer includes depositing silicon oxide.

5. The method of claim 3, wherein the step of forming the first conductive layer includes depositing polysilicon.

6. The method of claim 5, wherein the step of etching the first conductive layer includes a plasma-etching method.

7. The method of claim 5, wherein the porous insulating layer has a thickness of about 500 Å to 2000 Å above the firs conductive layer.

8. The method of claim 5, wherein the porous insulating layer has a plurality of pores each having a size ranging from 20 nm to 40 nm.

9. The method of claim 5, wherein each long and narrow crevices has a width ranging from 20 nm to 40 nm.

10. The method of claim 5, wherein the size of the pores in the step of forming the porous insulating layer can be controlled by changing parameters such as reacting material, temperature, acidity/alkalinitalue, reacting time and drying conditions.

11. The method of claim 5, wherein the step of forming the dielectric layer includes depositing high-k dielectric material.

12. The method of claim 5, wherein the step of forming the second conductive layer includes depositing polysilicon.

13. The method of claim 5, wherein after the step of forming the fork-shaped structure, further includes forming a hemispherical grained polysilicon (HSG-poly) layer over the fork-shaped structure so that surface area of the fork-shaped structure can be increased.

14. A method of manufacturing a capacitor of dynamic random access memory, wherein a source/drain region is formed in a semiconductor substrate and an insulating layer is formed over the substrate, comprising:

forming a storage node opening in the insulating layer, wherein the storage node opening exposes the source/drain region;

forming a first conductive layer in the storage node opening and above the insulating layer;

forming a poroius oxide layer by depositing nanoporous silica over the first conductive layer;

performing a plasma-etching operation using the porous oxide layer as a mask, wherein a portion of the first conductive layer is etched away, thereby forming a plurality of long and narrow crevices in the first conductive layer so that the first conductive layer becomes a fork-shaped structure that later functions as a lower electrode of the capacitor;

removing the porous oxide layer; and forming a dielectric layer over the fork-shaped structure and then forming a second conductive layer over the dielectric layer, wherein the second conductive layer serves as an upper electrode of the capacitor.

15. A method of manufacturing a capacitor of dynamic random access memory, wherein a source/drain region is formed in a semiconductor substrate and an insulating layer is formed over the substrate, the method comprising the steps of:

forming a storage node opening in the insulating layer, wherein the storage node opening exposes the source/drain region;

forming a first conductive layer in the storage node opening and above the insulating layer;

forming a porous oxide layer by depositing xerogel sol-gel over the first conductive layer;

performing a plasma-etching operation using the porous oxide layer as a mask, wherein a portion of the first conductive layer is etched away, thereby forming a polarity of long and narrow crevices in the first conductive layer so that the first conductive layer becomes a fork-shaped structure that later functions as a lower electrode of the capacitor;

removing the porous oxide layer; and forming a dielectric layer over the fork-shaped structure and then forming a second conductive layer over the dielectric layer, wherein the second conductive layer serves as an upper electrode of the capacitor.

16. A method of manufacturing an capacitor of dynamic random access memory, wherein a source/drain is formed in a semiconductor substrate and an insulating layer is formed over the substrate, comprising:

forming a storage node opening in the insulating layer, wherein the storage node opening expose the source/drain region;

forming a first conductive layer in the storage node opening and above the insulating layer;

forming a porous insulating layer over the first conductive layer by depositing and spinning the porous insulating material for about 30 seconds, performing an edge bead removal operation for 15 seconds, reacting for about 120 seconds, and finally, drying and baking for another 120 seconds;

plasma-etching the first conductive layer using the porous insulating layer as a mask, thereby forming a plurality of long and narrow crevices in the first conductive layer so that the first conductive layer becomes a fork-shaped structure that later functions as a lower electrode of the capacitor;

removing the porous insulating layer; and forming a dielectric layer over the fork-shaped structure and the forming a second conductive layer over the dielectric layer, wherein the second conductive layer serves as an upper electrode of the capacitor.

17. The method of claim 16, wherein the step of forming the insulating layer includes depositing silicon oxide.

18. The method of claim 16, wherein the step of forming the first conductive layer includes depositing polysilicon.

19. The method of claim 18, wherein the porous insulating layer has a thickness of about 500 Å to 2000 Å above the first conductive layer.

20. The method of claim 18, wherein the porous insulating layer has a plurality of pores, each pore having a size ranging from 20 nm to 40 nm.

21. The method of claim 18, wherein the long and narrow crevices has a width ranging from 20 nm to 40 nm.

22. The method of claim 18, wherein the size of the pores in the step of forming the porous insulating layer can be controlled by changing parameters such as reacting material, temperature, acidity/alkalinity value, reacting time and drying conditions.

23. The method of claim 18, wherein the step of forming the dielectric layer includes depositing high-k dielectric material.

24. The method of claim 18, wherein the step of forming the second conductive layer includes depositing polysilicon.

25. The method of claim 18, wherein after the step of forming the fork-shaped structure, further includes forming a hemispherical grained polysilicon (HSG-poly) layer over the fork-shaped structure so that surface area of the fork-shaped structure can be increased further.

26. The method of claim 16, wherein the step of removing the porous insulating layer includes a dry etching method.

27. The method of claim 16, wherein the step of removing the porous insulating layer includes a wet etching method.

* * * * *